(12) United States Patent
Montvelishsky

(10) Patent No.: US 7,768,435 B2
(45) Date of Patent: Aug. 3, 2010

(54) METHOD AND APPARATUS FOR DIGITAL TO ANALOG CONVERSION

(75) Inventor: Michael B. Montvelishsky, Burlingame, CA (US)

(73) Assignee: VNS Portfolio LLC, Cupertino, CA (US)

( * ) Notice: Subject to any disclaimer, the term of this patent is extended or adjusted under 35 U.S.C. 154(b) by 0 days.

(21) Appl. No.: 12/177,795

(22) Filed: Jul. 22, 2008

(65) Prior Publication Data
US 2009/0033536 A1 Feb. 5, 2009

Related U.S. Application Data

(60) Provisional application No. 60/962,559, filed on Jul. 30, 2007.

(51) Int. Cl.
H03M 1/66 (2006.01)

(52) U.S. Cl. ..................................................... 341/144

(58) Field of Classification Search ................. 341/144, 341/141, 155, 110; 704/203, 211, 267, 500
See application file for complete search history.

(56) References Cited

U.S. PATENT DOCUMENTS 4,360,886 A * 11/1982 Kostas et al. ................. 700/264
5,227,794 A * 7/1993 Whikehart .................. 341/141
7,107,801 B2 * 9/2006 Chartrain et al. .............. 70/185

FOREIGN PATENT DOCUMENTS

| KR | 10-1999-0036970 A | 5/1999 |
|---|---|---|
| KR | 10-2005-0112523 A | 11/2005 |
| KR | 10-2007-0048540 A | 5/2007 |
| KR | 10-2007-0052461 A | 5/2007 |
| WO | WO 2009/017681 A1 | 2/2009 |

OTHER PUBLICATIONS

PCT Application No. PCT/US2008/009067, International Search Report and Written Opinion dated Dec. 29, 2008.

* cited by examiner

Primary Examiner—Brian Young
(74) Attorney, Agent, or Firm—Henneman & Associates, PLC; Larry E. Henneman, Jr.

(57) ABSTRACT

The apparatus described is a multi-core processor 505 adapted to provide digital to analog conversion. At least one 2010 of the cores 510 is used to make the conversion, another group of cores 2005 can provide the source of a digital stream of information such as audio visual signals. The stream is conveyed to processor 2010 optionally by a transfer processor 2015. The method of the invention divides each word of an incoming digital stream of information into a most significant and least significant portions. The most and least significant portions control the production of electrical charges which are added together to produce an analog electrical signal proportional to the values of the words in the digital stream.

20 Claims, 6 Drawing Sheets

METHOD AND APPARATUS FOR DIGITAL TO ANALOG CONVERSION

RELATED APPLICATIONS

This application claims the benefit of provisional U.S. Patent Application Ser. No. 60/962,559 filed on Jul. 30, 2007 entitled "Digital to Analog Converter" by at least one common inventor which is incorporated herewith by reference in its entirety.

FIELD OF INVENTION

This invention pertains to computing systems. In particular, this invention pertains to the arithmetic logic unit of a Reduced Instruction Set Computer (RISC) which incorporates simultaneous execution of different operations of complex calculations. With still greater particularity, the invention pertains to methods and apparatus for converting digital data into analog data in a RISC computer.

BACKGROUND OF INVENTION

In many situations it is desirable to convert binary data into an analog signal. A common application is in audio equipment modern source materials such as Compact Disk (CD) Digital Video Disk (DVD), Computer Audio Formats such as MP3, MP4, AAC and OGG all store and read out audio/video (AV) information in digital form. In addition, Digital Signal Processing and most Digital Rights Management encoders deal with Digital Signals. Playback apparatus such as speakers, headphones and many video displays require an analog input. Digital signals, in addition, contain high frequency harmonics which result in distortion and damage to components when directly inputted to an analog component. This had led to a growing demand for inexpensive efficient Digital to analog converters (DAC).

The operation of a Digital to analog converter (DAC) is to convert a fixed point binary value into a physical quantity such as an electric voltage or current. Ideally, the voltage or current from a DAC is characterized by a linear function of the input binary value.

Assume a maximum voltage $V_{max}$ and a minimum voltage $V_{min}$ can be produced from a certain six bit DAC. One way to scale the voltage between $V_{max}$ and $V_{min}$ for a six bit DAC is to utilize $V_{min}$ as a base voltage and to apply an increment to this voltage $\Delta V$ (also termed the increment between voltages) defined as $(V_{max}-V_{min})/2^6$. The possible range of voltage values for this example include $V_{min}$, $V_{min}+\Delta V$, $V_{min}+2\Delta V$, $V_{min}+3\Delta V$, ..., $V_{min}+(2^6-1)\Delta V$. This method of voltage scaling does not produce the precise maximum voltage, but if the bit width of the DAC were great enough, the difference between the last discrete voltage in the range and $V_{max}$ would be nearly identical.

Regardless of the bit width of the DAC there will always be gaps in the voltages produced as is the case for any discrete range. In practice the hardware DAC is of a fixed length and it is only possible to produce the scale of voltages from the bit width of the DAC. It is advantageous to utilize a method for digital to analog conversion which can produce greater resolution than a hardware DAC can provide.

SUMMARY OF THE INVENTION

The invention provides an apparatus to quickly and linearly convert binary data into analog information. The apparatus preferably utilizes an array of computers connected to each other by one drop busses. Use of this apparatus will bring digital signal procession into use even for the most simple customer applications. The method uses a computational procedure that takes advantage of the dispersed computing arrangement that is superior to existing methods in speed and accuracy.

The invention divides each word of an incoming digital stream of information into most significant and least significant portions. The most and least significant portions control the production of electrical charges which are added together to produce an analog electrical signal proportional to the values of the words in the digital stream.

DETAILED DESCRIPTION OF THE FIGURES

Figure 1:
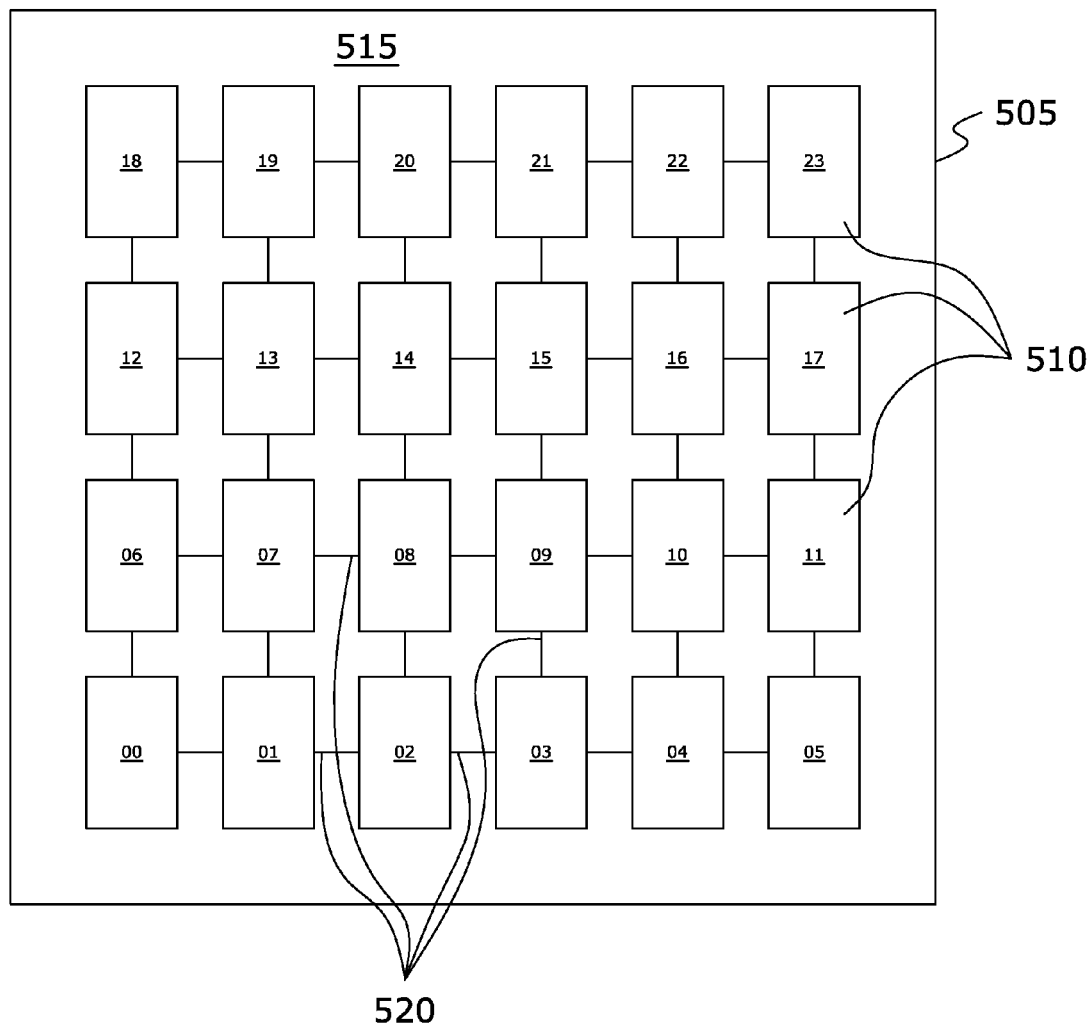
FIG. 1 is a block diagram of the apparatus of the invention.

FIG. 1 is a block diagram of the apparatus of the invention. The apparatus includes a computer array 505 having a plurality, twenty four in this case of computers 510. Computers 510 are sometimes also referred to as "cores" or "nodes" when the array is implemented in a single module or on a single semiconductor die 515. Computers 510 are referred to herein collectively as c18 computers 510 and individually by the numeric value assigned 00-23 of each c18 computer. For example, the c18 computer located in the top left of the die 515 is referred to as node 18. Each of the computers 510 is a generally independently functioning digital processor and is interconnected to the others by a plurality of interconnecting buses 520. The array 505 here may particularly be a SEAforth®-24a device by IntellaSys® Corporation of Cupertino, Calif., a member of The TPL Group of companies. Busses 520 are one drop busses in the SEAforth®-24

Figure 2:
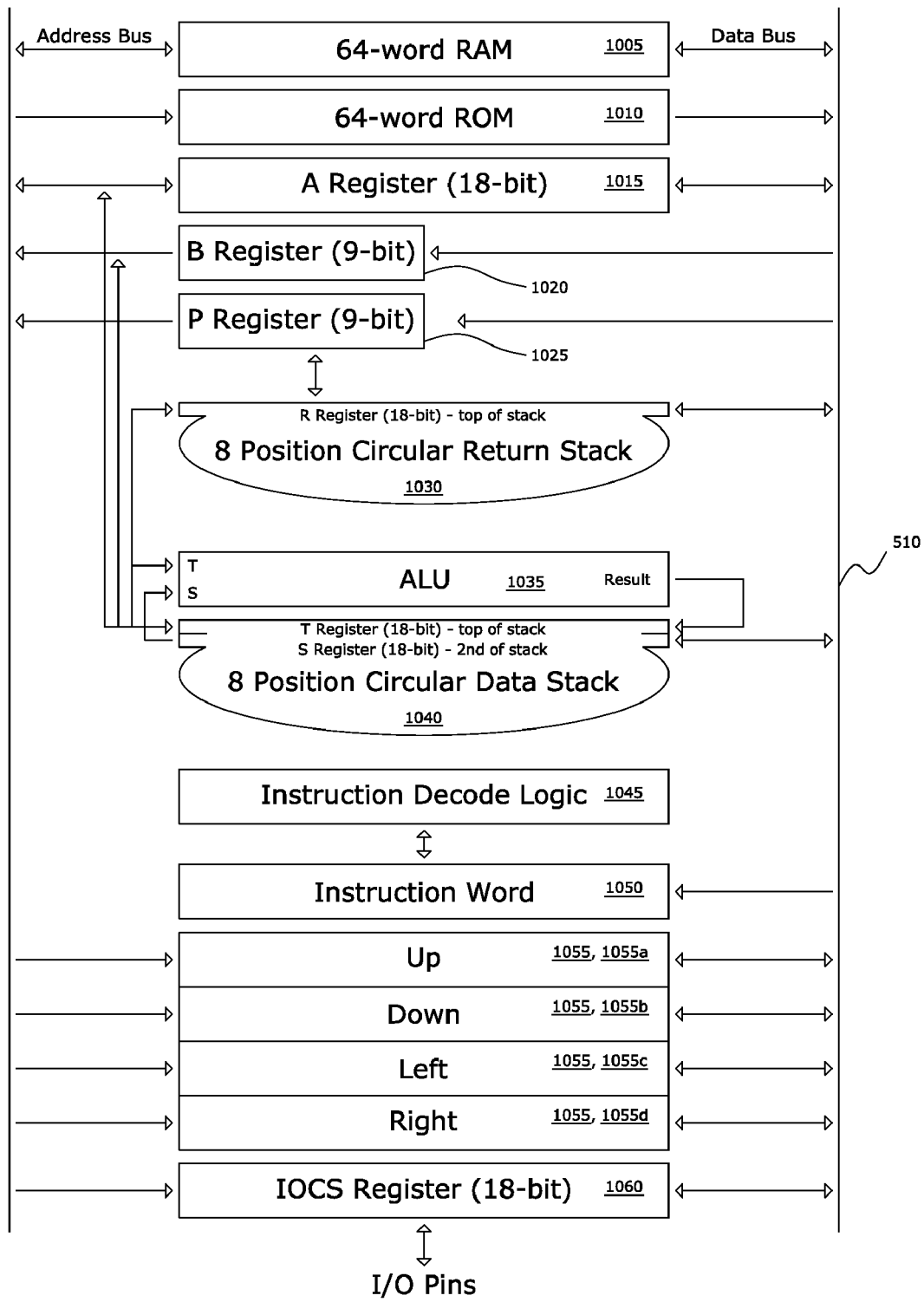
FIG. 2 is a block diagram of one of the processors in FIG. 1.

FIG. 2 is a block diagram of the major internal features of one of the computers 510 in FIG. 2. Each computer 510 is a generally and independently functioning digital processor, including a 64-word quantity of random access memory (RAM 1005), a 64-word quantity of read only memory (ROM 1010), an 18-bit variable "A" register (A-register 1015), a 9-bit variable "B" register (B-register 1020), and a 9-bit variable "P" register (P-register 1025). Also included are a return stack 1030 with top element of the return stack labeled R, an arithmetic and logic unit (ALU 1035), and a data stack 1040 with top element of the data stack labeled T and second element of the data stack labeled S. Each element apart of the return stack 1030 and data stack 1040 is an 18-bit register. Further included are an instruction decode logic 1045, an instruction word register 1050, four communication ports (collectively referred to as ports 1055 and individually as the up-port 1055a, the down port 1055b, the left port 1055c, and the right port 1055d), and an 18-bit input/output control and status register (IOCS-register 1060).

The computer array 505 of FIG. 1, more specifically referred to as an S24 device, contains 24 dual stack based microprocessor cores that are controlled by the execution of the instructions as part of the VentureForth® programming language.

TABLE 1

| Hex (bit) | | | Binary (bit) | | | | | Hex (bit) | | | Binary (bit) | | | |
|---|---|---|---|---|---|---|---|---|---|---|---|---|---|---|
| 1 | 0 | | 4 | 3 | 2 | 1 | 0 | 1 | 0 | | 4 | 3 | 2 | 1 |
| 0 | 0 | ; (return) | 0 | 0 | 0 | 0 | 0 | 1 | 0 | +* | 1 | 0 | 0 | 0 |
| 0 | 1 | ;: | 0 | 0 | 0 | 0 | 1 | 1 | 1 | 2* | 1 | 0 | 0 | 0 |
| 0 | 2 | jump | 0 | 0 | 0 | 1 | 0 | 1 | 2 | 2/ | 1 | 0 | 0 | 1 |
| 0 | 3 | call | 0 | 0 | 0 | 1 | 1 | 1 | 3 | not | 1 | 0 | 0 | 1 |
| 0 | 4 | unext | 0 | 0 | 1 | 0 | 0 | 1 | 4 | + | 1 | 0 | 1 | 0 |
| 0 | 5 | next | 0 | 0 | 1 | 0 | 1 | 1 | 5 | and | 1 | 0 | 1 | 0 |
| 0 | 6 | if | 0 | 0 | 1 | 1 | 0 | 1 | 6 | xor | 1 | 0 | 1 | 1 |
| 0 | 7 | -if | 0 | 0 | 1 | 1 | 1 | 1 | 7 | drop | 1 | 0 | 1 | 1 |
| 0 | 8 | @p+ | 0 | 1 | 0 | 0 | 0 | 1 | 8 | dup | 1 | 1 | 0 | 0 |
| 0 | 9 | @a+ | 0 | 1 | 0 | 0 | 1 | 1 | 9 | pop | 1 | 1 | 0 | 0 |
| 0 | a | @b | 0 | 1 | 0 | 1 | 0 | 1 | a | over | 1 | 1 | 0 | 1 |
| 0 | b | @a+ | 0 | 1 | 0 | 1 | 1 | 1 | b | a@ | 1 | 1 | 0 | 1 |
| 0 | c | !p+ | 0 | 1 | 1 | 0 | 0 | 1 | c | ·(nop) | 1 | 1 | 1 | 0 |
| 0 | d | !a+ | 0 | 1 | 1 | 0 | 1 | 1 | d | push | 1 | 1 | 1 | 0 |
| 0 | e | !b | 0 | 1 | 1 | 1 | 0 | 1 | e | b! | 1 | 1 | 1 | 1 |
| 0 | f | !a | 0 | 1 | 1 | 1 | 1 | 1 | f | a! | 1 | 1 | 1 | 1 |

Table 1 is a table of the thirty two operation codes (sometimes referred to as op-codes) of this language, along with the hex, mnemonic, and binary representations. These op-codes are divided into two main categories, memory instructions and arithmetic logic unit (ALU) instructions, with sixteen op-codes in each division. The memory instructions are shown in the left half of Table 1 and the ALU instructions are shown in the right half of Table 1. It can be appreciated that one clear distinction between the divisions of op-codes is that the memory instructions contain a zero in the left-most bit whereas the ALU instructions contain a one in the left-most bit. Furthermore, this is the case regardless of whether the op-codes are viewed in their hex or binary representations.

Figure 3:
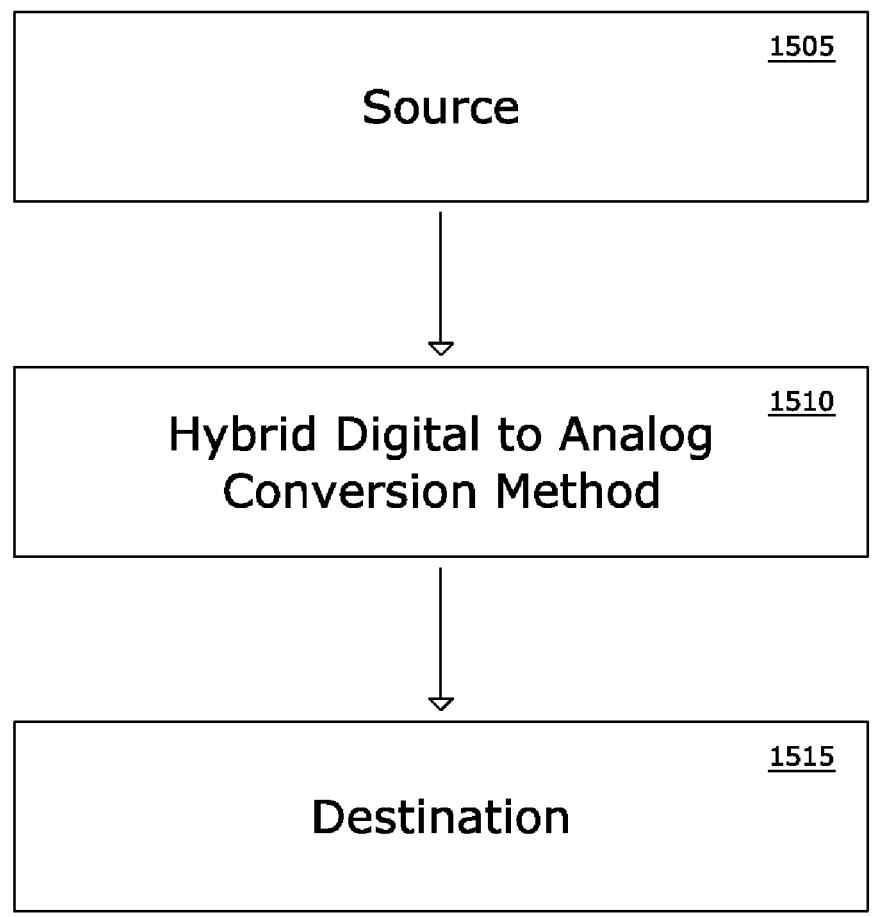
FIG. 3 is a simplified flow chart of the method of the invention.

FIG. 3 is a simplified flow chart of the method of the invention. FIG. 3 includes three steps representing source to destination of data processing through the use of a hybrid digital to analog conversion method, beginning with a source 1505. Source 1505 feeds hybrid digital to analog converter 1510 making up the hybrid digital to analog conversion method. Finally, hybrid digital to analog converter 1510 feeds the destination, 1515.

Figure 4:
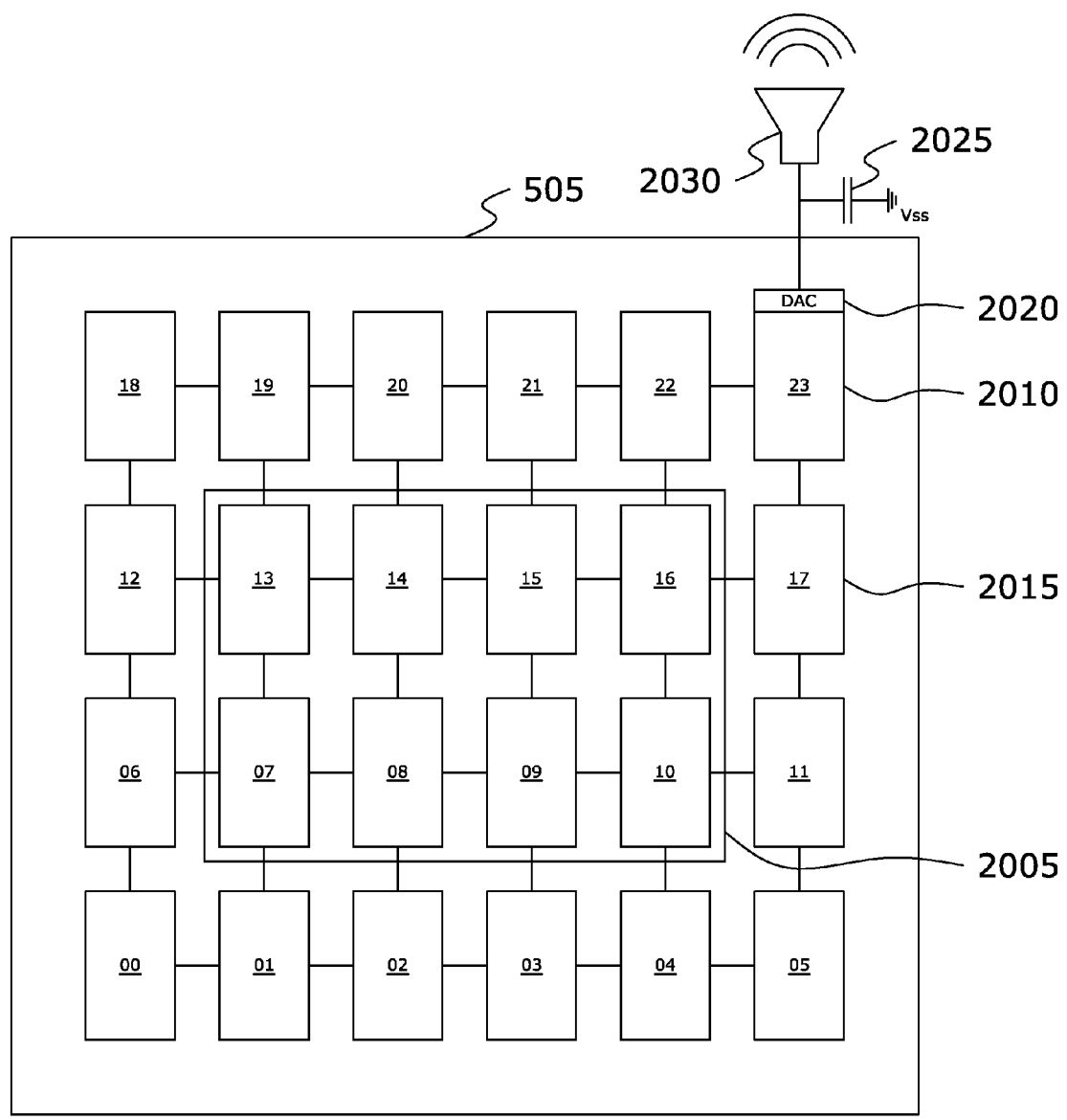
FIG. 4 is a complete block diagram of FIG. 1 embodiment of the invention.

FIG. 4 shows an array of processors like the one in FIG. 1 utilized for executing blocks associated with the flow chart in FIG. 3 for the specific example of sound generation and transmission. The region of computers denoted by general reference character 2005 represents a group of computers which executes sound generation or equivalently the source in block 1505 of FIG. 3. Sound generation in region 2005 produces an indefinite stream of 13 bit values which are passed from computer 16 to computer 17. This region could alternatively be replaced by any digital media source in which thirteen bit values are produced. The single computer 23, also referred to by general reference character 2010, is responsible for executing the hybrid digital to analog conversion method in block 1510 of FIG. 3. Connecting the source generation region 2005 and the computer performing the digital to analog conversion method 2010 is node 17, also referred to by general reference character 2015, which is simply a bridge between the two processes. Shown adjacent to computer 23 and which is actually a part of the internal structure of computer 23, is a six bit hardware digital to analog converter (DAC) referred to by general reference character 2020. The DAC requires a six bit binary value as an input and will convert that input to a current, I, scaled between $I_{min}$ and $I_{max}$ as indicated by the six bits which feed the transistors that make up the DAC. The current from the DAC will then charge the capacitor 2025 shown in parallel with the speaker 2030. The speaker receiving a Voltage input as a result of the current produced from the DAC and the capacitor 2025 will produce sound or equivalently complete the destination process in block 1515 of FIG. 3.

Figure 5:
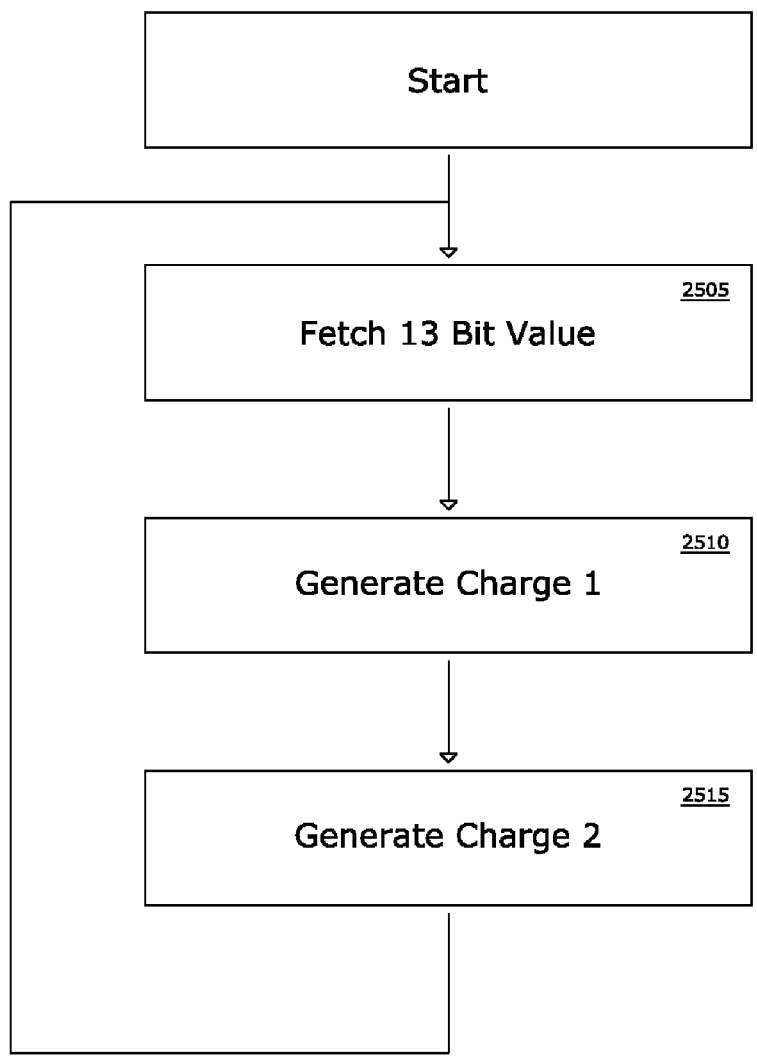
FIG. 5 is a flow chart of a FIG. 3 embodiment of the method of the invention.

FIG. 5 is a block diagram showing the process of performing the hybrid digital to analog conversion method in node 23 of FIG. 4, beginning with a block 2505 in which a thirteen bit value is fetched from node 17 of FIG. 4. Next, the thirteen bit value is used as the input for the generation of a first charge on the capacitor 2025 of FIG. 4, as well as the input for the generation of a second charge on the capacitor 2025 in blocks 2510 and 2515 respectively of FIG. 5. The generation of the first charge on the capacitor 2025 is considered a course charging in which the current is fixed but the time is variable, while the generation of the second charge on the capacitor is considered a fine adjustment charging in which the current is variable and the time is fixed. Last, the process repeats for each new thirteen bit value fetched from node 17 of FIG. 4.

Figure 6:
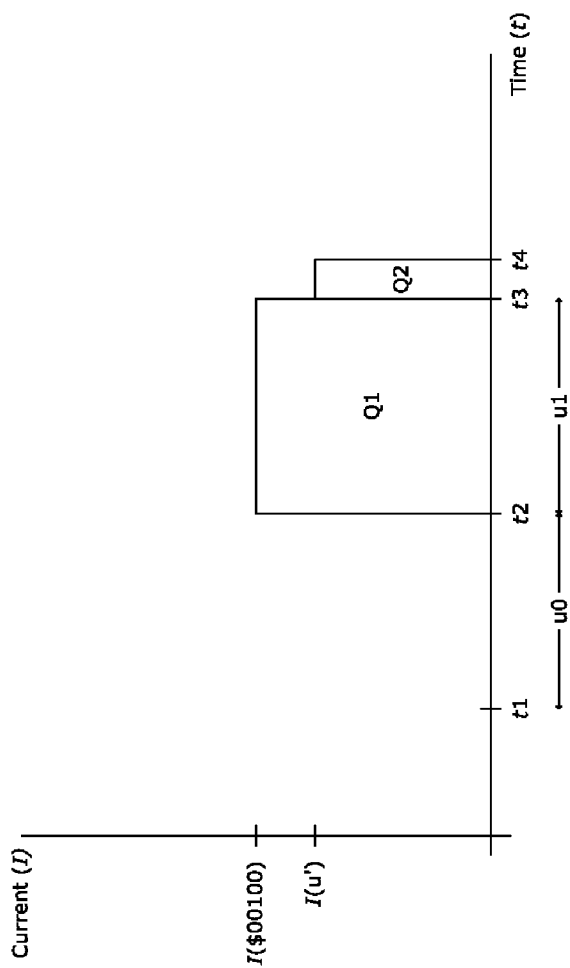
FIG. 6 is a plot of current (I) v. time (t) for the processing of a single thirteen bit value beginning with sound generation and ending with sound transmission as per the invention.

FIG. 6 is a plot of current (I) v. time (t) for the processing of a single thirteen bit value beginning with sound generation and ending with sound transmission. The plot in FIG. 6 shows the current from the six bit DAC 2020 of FIG. 4 for the processing a single thirteen bit value in the hybrid digital to analog conversion method contained in node 23 of FIG. 4. The horizontal axis is measured in time while the vertical axis is measured in current, I. Along the time axis, $t_1$ represents the amount of time to execute the instructions not a part of actually producing the first and second charging of the capacitor 2025 of FIG. 4, but still necessary to set up these two tasks. The time between markers $t_1$ and $t_2$ represents a delay that is determined from the thirteen bit value fetched from node 17 of FIG. 4. The time between markers $t_2$ and $t_3$ represents the amount of time in which the current, I produced from the DAC 2020 of FIG. 4 as a function of the input $00100 is maintained. This region is also referred to as $Q_1$ and is the course charging of the capacitor 2025 of FIG. 4 at a fixed current for a variable time for each processing of a thirteen bit value in a step 2510 of FIG. 5. The time between markers $t_3$ and $t_4$ in FIG. 6 represents the constant amount of time for the $Q_2$ process. This is a time interval equivalent to the execution of a single op-code on the c18 computer. During this time interval the current, I produced from the DAC 2020 of FIG. 4 is a function of the input u'. This region is also referred to as $Q_2$ and is the fine tune adjustment charging of the capacitor 2025 of FIG. 4 at a variable current for a fixed time for each processing of a thirteen bit value in a step 2515 of FIG. 5. The two charging regions $Q_1$ and $Q_2$ produce a Voltage for the speaker 2030 of FIG. 4 equivalent to the division of the sum of $Q_1$ and $Q_2$ with the capacitance of the capacitor 2025 of FIG. 4.

The following description is a Forth embodiment for carrying out the hybrid digital to analog conversion method in node 23 of FIG. 4, and in particular covers the process of fetching a 13 bit value from node 17 of FIG. 4, and determining a first and second charging to a capacitor 2025 of FIG. 4 in steps 2505, 2510, and 2515 of the block diagram in FIG. 5.

Forth programs are written bottom up, meaning they are read from the bottom and compiling is done without forward references. However, the following Forth embodiment of the hybrid digital to analog conversion method is displayed in an execution order, and not necessarily the order in which the code would appear in a text file. The choice of labels for the Forth words is chosen to carefully reflect their function. For example, a Forth word calc_derivative will determine the derivative of a function, as this is the implied meaning. Stack comments are also shown in parenthesis next to the Forth word and give data stack 1040 of FIG. 2 and return stack 1030 of FIG. 2 status prior to and after the execution of the Forth word.

```
: dac ( 0 - 0 )
  begin
    prep_regs
    prep_stks
    calc_hold1
    calc_delay
    calc_amp2
    use_hardware_dac
  again ;
```

The hybrid digital to analog conversion method is contained in the colon definition, : dac. Shown to the right of the colon definition beginning with the left paren and ending with the right paren is a comment. Inside the parenthesis is the contents of the data stack 1040 of FIG. 2 prior to the execution of the colon definition and the contents of the data stack after the execution of the colon definition. In the case of the Forth words : dac there are no net stack effects, a numerical value of 0 is on the stack before and after the execution of the Forth words. As part of every colon definition, a semicolon provides a return to the location from which the colon definition was called. The Forth words begin and again as part of the colon definition : dac create a loop in which the Forth words inside the loop are executed until a stopping condition is reached.

```
macro out_port ( - n )
  'iocs #
macro in_port ( - n )
  '-d-- #
macro prep_regs ( 0 - 0 )
  in_port a! out_port
  b!
```

The Forth word prep_regs is shown as a macro followed by the stack effects comment in parenthesis. Like the Forth word suggests, prep_regs duty is to initialize (prepare) the A-register 1015 and B-register 1020 of FIG. 2. The A-register will contain the address of the down port, while the B-register will contain the address for the IOCS-register 1060 of FIG. 2.

```
macro prep_stks ( 0 - 0 0 n n R: - 0 )
  dup dup push
  @a dup
```

The Forth word prep_stks is shown as a macro followed by the stack effects comment in parenthesis where the stack effects also include the return stack effects in addition to just the data stack effects. The Forth word prep_stks is used to prepare the data and return stacks for use in upcoming Forth words. In executing the macro, the value of 0 initially on the data stack is duplicated and passed to the return stack, while a single value fetched from the down port is duplicated and left on the data stack.

```
macro 17bitmask ( - n )
  $1ffff #
macro calc_hold1 ( 0 0 n n - 0 0 n u1 R: 0 - u1 0 )
  val_1 . +
  2/ 17bitmask and
  2/ 2/ 2/
  2/ dup push
```

The Forth word calc_hold1 is shown as a macro followed by the stack effects comment and is responsible for determining the length of time between $t_2$ and $t_3$ in the plot of FIG. 6 for the first charging to the capacitor 2025 of FIG. 4 in a step 2510 of FIG. 5. The length of time for the initial charge to the capacitor is the value u1 calculated as the eight most significant bits of the thirteen bit value fetched from node 17.

```
macro val_2 ( - n )
  $02000 #
macro calc_delay ( 0 0 n u1 - 0 0 n R: u1 0 - u0 u1 0 )
  val_2 not . +
  not push
```

The value left on the data stack after the execution of the macro calc_hold1 is needed for use in calculating the timer interval between $t_1$ and $t_2$ which is a delay before the first charging of the capacitor 2025 of FIG. 4. The Forth word calc_delay is shown as a macro above with the data and return stack effects shown in parenthesis. The value of the delay referred to as u0 is the negation of the sum u1 and the negation of val_2 also shown as a macro. The numerical value of $02000 represented by val_2 is chosen to specifically work with any thirteen bit value fetched from node 17 to create the appropriate total delay (recall that there is an inherent delay caused by executing the Forth code not associated with the charging) between the combined dual charging of the capacitor 2025 of FIG. 4.

```
macro 8bitmask ( - n )
  $000ff #
```

-continued

```
macro val_1 ( - n )
    $20000 #
macro calc_amp2 ( 0 0 n - 0 0 u' R: u0 u1 0 - u0 u1 0 )
    val_1 . +
    2* 2* 2* 8bitmask
    and
```

The Forth word calc_amp2 is shown as a macro followed by the stack effects comment and is responsible for determining the value which will be passed to the six bit hardware DAC 2020 of FIG. 4. The calculated value passed to the DAC 2020 of FIG. 20 is referred to as u' and is calculated from a duplicate of the thirteen bit value fetched from node 17 of FIG. 4. The calculation involves manipulating the thirteen bit number so that only the five least significant bits are sent to the DAC 2020 of FIG. 4 bit shifted as appropriate for the six bit hardware DAC 2020 of FIG. 4.

```
macro amp1 ( - n )
    $00100 #
macro use_hardware_dac ( 0 0 u' - 0 R: u0 u1 0 - )
    amp1
    begin unext !b
    begin unext !b
    begin unext !b
```

The Forth word use_hardware_dac is shown as a macro followed by the stack effects comment and is responsible for sending the correct numerical values to the six bit hardware DAC 2020 of FIG. 4, as well as the length of time for each numerical value to be producing a current, I from the DAC. The data stack 1040 of FIG. 2 prior to the execution of the macro use_hardware_dac contains 0 0 u' while the return stack 1030 of FIG. 2 contains u0 u1 0. The Forth word amp1 which is macro puts an additional value of $00100 onto the top of the data stack. The macro amp1 is the constant valued input to the DAC 2020 of FIG. 20 producing a current, I as a function of $00100 at a time $t_2$ along the horizontal axis in the plot of FIG. 6. Recall that it is this region of the plot in FIG. 6 which is of constant (fixed) current, I for a variable length time. The Forth words begin and unext following the Forth word amp1 execute an empty loop in which the Forth word unext is executed the number of times plus one as the value on the top of the return stack, u0. Hence, as previously mentioned, the value u0 is the delay before the first charging of the capacitor 2020 of FIG. 4 and is the time interval between $t_1$ and $t_2$ of FIG. 6. The Forth word !b consumes the top item on the data stack $00100 passing this value to the place where the B-register 1020 of FIG. 2 points, which in this case is the IOCS-register 1060 of FIG. 2. Storing this value to the IOCS-register enables the DAC which uses six bits of the value sent to the IOCS-register beginning with the third from the least significant bit. The enabled DAC will produce a current, I as a function of the input $00100 until a new value is sent to the six bit DAC. The amount of time in which the current, I produced as a function of the input $00100 is based on the amount of time needed to execute the second pair of Forth words begin and unext. These two Forth words consume the top item of the return stack, u1, and the value u1 is the amount of time plus one the current, I is produced as a function of the input $00100 to the DAC. The second Forth word !b will send to the place where the B-register points, which again is the IOCS-register the top item on the data stack, u'. Storing this value to the IOCS-register will again enable the DAC, but to a different and smaller value than before. At a position $t_3$ on the horizontal axis the current, I from the DAC which is a function of the input value to the DAC, u' is held for an amount of time previously referred to as unit. The unit time is a reference to the amount of time necessary to execute the third pair of Forth words begin and unext. Again, the amount of time to execute the empty loop is the value on the return stack, 0 plus one. Hence, the region of the plot in FIG. 6 labeled for second charging of the capacitor is of variable current based on the thirteen bit value fetched from computer 17 of FIG. 4 and a fixed time. Finally, the third !b Forth word sends the top item of the data stack 0 to the IOCS-register and enables the DAC to output no current, I.

While various embodiments have been described above, it should be understood that they have been presented by way of example only, and that the breadth and scope of the invention should not be limited by any of the above described exemplary embodiments, but should instead be defined only in accordance with the following claims and their equivalents.

INDUSTRIAL APPLICABILITY

The apparatus illustrated in FIG. 4 is particularly well adapted to embedded consumer application that require massive processing power and low power consumption.

The inventive method illustrated in FIG. 5 is intended to be widely used in a great variety of consumer electronic applications. It is expected that it will be particularly useful in applications where A/V data is used to be displayed on analog devices in digital audio signal processing and several types of electronic apparatus, and yet power consumption and heat production are important considerations.

Since the method of the present invention may be readily produced and integrated with existing tasks, input/output devices and the like, and since the advantages as described herein are provided, it is expected that they will be readily accepted in the industry. For these and other reasons, it is expected that the utility and industrial applicability of the invention will be both significant in scope and long lasting in duration.

The invention claimed is:

1. An apparatus for converting digital data streams into analog data streams comprising:
    a multi-core processor having a plurality of processing cores each having at least two ports for receiving inputs and producing outputs, dedicated RAM and ROM, and connected to adjacent processors cores by single drop busses for processing data;
    at least one of the processing cores for receiving digital information from another processor and converting the digital information into analog information and outputting the analog information through another port;
    an output connected to the one processing core for transporting the analog information to a load; and
    a second processor core for receiving digital information from a third processor core and transferring the digital information to the first processor core; and
    wherein the one processor core is located on the outer periphery of the multi-core processor.

2. An apparatus for converting digital data streams into analog data streams as in claim 1; further comprising a capacitor connected to the output.

3. An apparatus for converting digital data streams into analog data streams as in claim 1, wherein the third processor core is located in a central portion of the multi-core processor.

4. An apparatus for converting digital data streams into analog data streams as in claim 3, wherein the third processor is a member of a group of processors for generating sounds.

5. A method for converting digital information into analog information with a multi-core processor comprising the steps of:
  providing digital information from at least one core of the multi-core processor;
  transferring the digital information to a second core of the multi-core processor;
  converting the digital information to analog information in the second core;
  outputting the analog information from the second core to a load;
  a first charging step for producing a charge proportional to the digital value; and
  a second charging step for producing a charge proportional to the digital value of the digital information.

6. A method for converting digital information into analog information as in claim 5, wherein the transferring step is performed by a third core.

7. A method for converting digital information into analog information as in claim 5, comprising the further step of generating digital information with the one core for further processing.

8. A method for converting digital information into analog information as in claim 5, comprising the further step of dividing the digital information received into a most significant portion and a least significant portion.

9. A method for converting digital information into analog information as in claim 8, wherein the most significant portion provides the input for the first charging step and the least significant portion provides the input for the second charging step.

10. A method for converting digital information into analog information as in claim 9, wherein the output of the first charging step is a constant electrical current for a time interval proportional to the value of the most significant portion of the digital input; and, the output of the second charging step is an electrical current proportional to the value of the least significant portion of the digital input for a constant time interval.

11. A method for converting a digital value stream into an analog signal proportional to the digital signal, comprising the steps of, fetching the first digital value from the stream; and, dividing the first digital value into a most significant portion and a least significant portion; and producing an electrical charge to the output that is proportional to the most significant portion; and adding to the charge an electrical charge proportional to the least significant portion; and fetching the second digital value of the digital process and continuing until the digital stream ceases.

12. A method for converting a digital value stream into an analog signal proportional to the digital signal as in claim 11, wherein the output of the producing step is a constant electrical current for a time interval proportional to the value of the most significant portion of the digital input; and, the output of the adding step is an electrical current proportional to the value of the least significant portion of the digital input for a constant time interval.

13. A method for converting a digital value stream into an analog signal proportional to the digital signal as in claim 12, wherein the output of the producing step and the adding step is stored on a capacitor and delivered to a load.

14. A method for converting a digital value stream into an analog signal proportional to the digital signal as in claim 11, wherein the digital stream is a sound signal.

15. A method for converting a digital value stream into an analog signal proportional to the digital signal as in claim 14, wherein the digital sound signal is a 13 bit digital stream.

16. A method for converting a digital value stream into an analog signal proportional to the digital signal as in claim 15, wherein the most significant portion is the first eight bits of the 13 bit stream and the least significant portion is the last five bits of the 13 bit stream.

17. A method for converting a digital value stream into an analog signal proportional to the digital signal as in claim 12, wherein the charges produce are determined by an instruction stored in a core of a multi-core processor.

18. A method for converting a digital value stream into an analog signal proportional to the digital signal as in claim 17, wherein the instruction is a forth word.

19. A method for converting digital information into analog information with a multi-core processor comprising the steps of:
  providing digital information from at least one core of the multi-core processor;
  transferring the digital information to a second core of the multi-core processor;
  converting the digital information to analog information in the second core; and
  outputting the analog information from the second core to a load; and
  wherein the transferring step is performed by a third core.

20. A method for converting digital information into analog information with a multi-core processor comprising the steps of:
  providing digital information from at least one core of the multi-core processor;
  transferring the digital information to a second core of the multi-core processor;
  converting the digital information to analog information in the second core;
  outputting the analog information from the second core to a load; and
  generating digital information with the one core for further processing.

* * * * *